(12) United States Patent
Shimura

(10) Patent No.: US 10,020,780 B2
(45) Date of Patent: Jul. 10, 2018

(54) AMPLIFIER

(71) Applicant: FUJITSU LIMITED, Kawasaki-shi, Kanagawa (JP)

(72) Inventor: Toshihiro Shimura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/419,516

(22) Filed: Jan. 30, 2017

(65) Prior Publication Data

US 2017/0230008 A1    Aug. 10, 2017

(30) Foreign Application Priority Data

Feb. 4, 2016  (JP) .................................. 2016-020297

(51) Int. Cl.
  *H03F 3/45*  (2006.01)
  *H03F 1/02*  (2006.01)
  *H03F 3/193*  (2006.01)

(52) U.S. Cl.
  CPC ........... *H03F 1/0233* (2013.01); *H03F 3/193* (2013.01); *H03F 3/45179* (2013.01); *H03F 2200/451* (2013.01); *H03F 2203/45024* (2013.01); *H03F 2203/45116* (2013.01); *H03F 2203/45332* (2013.01)

(58) Field of Classification Search
  CPC ... H03F 1/22; H03F 1/223; H03F 3/45; H03F 1/226
  USPC .......................................... 330/254, 260, 311
  See application file for complete search history.

(56) References Cited

U.S. PATENT DOCUMENTS

| | | |
|---|---|---|
| 6,255,889 B1 | 7/2001 | Branson |
| 6,396,330 B1 | 5/2002 | Fujii |
| 7,697,915 B2 | 4/2010 | Behzad et al. |
| 8,294,515 B1 * | 10/2012 | Riekki ................ H03F 3/45179 330/283 |
| 9,413,309 B1 | 8/2016 | Zhao et al. |
| 2006/0229039 A1 | 10/2006 | Behzad |

(Continued)

FOREIGN PATENT DOCUMENTS

| | | |
|---|---|---|
| EP | 1 480 333 A2 | 11/2004 |
| JP | 2005-012770 A | 1/2005 |
| JP | 2006-254419 A | 9/2006 |

OTHER PUBLICATIONS

Extended European Search Report of related European Patent Application No. 17154161.8 dated Jun. 13, 2017.

*Primary Examiner* — Steven J Mottola
(74) *Attorney, Agent, or Firm* — Arent Fox LLP

(57) ABSTRACT

An amplifier including a first cascode circuit including a first transistor and a second transistor whose source or emitter is coupled to a drain or a collector of the first transistor, a second cascode circuit being a differential pair with the first cascode circuit, the second cascode circuit including a third transistor whose source or emitter is coupled to a source or an emitter of the first transistor and a fourth transistor whose source or emitter is coupled to a drain or collector of the third transistor, a first feedback path that couples between an output terminal of the third transistor and an input terminal of the first transistor, the first feedback path including a first capacitive element, and a second feedback path that couples between an output terminal of the first transistor and an input terminal of the third transistor, the second feedback path including a second capacitive element.

2 Claims, 32 Drawing Sheets

(56) References Cited

U.S. PATENT DOCUMENTS

| | | | |
|---|---|---|---|
| 2006/0284670 A1* | 12/2006 | Eid | H03F 1/14 327/563 |
| 2007/0120603 A1 | 5/2007 | Chang et al. | |
| 2007/0216481 A1 | 9/2007 | Jimenez et al. | |
| 2012/0319782 A1 | 12/2012 | Nam et al. | |
| 2013/0063210 A1 | 3/2013 | Corsi et al. | |
| 2014/0049320 A1 | 2/2014 | Manetakis | |

* cited by examiner

AMPLIFIER

CROSS-REFERENCE TO RELATED APPLICATION

This application is based upon and claims the benefit of priority of the prior Japanese Patent Application No. 2016-020297, filed on Feb. 4, 2016, the entire contents of which are incorporated herein by reference.

FIELD

The embodiments discussed herein are related to an amplifier.

BACKGROUND

In recent years, application systems that use radio waves (for example, millimeter waves with extremely high frequencies (EHFs) of 30 GHz to 300 GHz) with strong straightness and relatively high frequencies for radio communication or radar are being actively developed. As such an application system, a phased array antenna system is known, which has antenna elements arrayed for channels and is configured to steer a radio wave beam by adjusting the phases of currents of the antenna elements, for example.

In the phased array antenna system, a large number of transmitters or receivers are used in order to increase an antenna aperture (antenna gain). However, if the number of transmitters or receivers is increased, consumed power increases. It is thus desirable that power to be consumed by amplifiers that are used in transmitters or receivers for channels be low. As a related-art document related to an increase in the gain of an amplifier, Patent Document 1 is known, for example.

As a semiconductor device (for example, a transistor) used in an amplifier that operates with a high frequency band of an EHF or higher, a compound semiconductor device, a silicon germanium (SiGe) semiconductor device, or the like is used. In recent years, due to the progress of technologies, a semiconductor device that uses a complementary metal oxide semiconductor (CMOS) is able to operate with a frequency band of an EHF or higher.

RELATED-ART DOCUMENT

Patent Document

[Patent Document 1] Japanese Laid-open Patent Publication No. 2006-254419

SUMMARY

According to an aspect of the invention, an amplifier including a first cascode circuit including a first transistor and a second transistor whose source or emitter is coupled to a drain or a collector of the first transistor, a second cascode circuit that forms a differential pair with the first cascode circuit, the second cascode circuit including a third transistor whose source or emitter is coupled to a source or an emitter of the first transistor and a fourth transistor whose source or emitter is coupled to a drain or collector of the third transistor, a first feedback path that couples between an output terminal of the third transistor and an input terminal of the first transistor, the first feedback path including a first capacitative element, and a second feedback path that couples between an output terminal of the first transistor and an input terminal of the third transistor, the second feedback path including a second capacitative element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a frequency band of an EHF or higher, the gains of transistors are reduced. Thus, if the number of stages at which transistors are connected is increased, the gains of amplifiers may increase in a frequency band of an EHF or higher. However, if the number of stages at which transistors are connected is increased, power consumed by amplifiers increases.

According to one aspect, an object is to provide an amplifier that may achieve a high gain with low consumed power.

Figure 1:
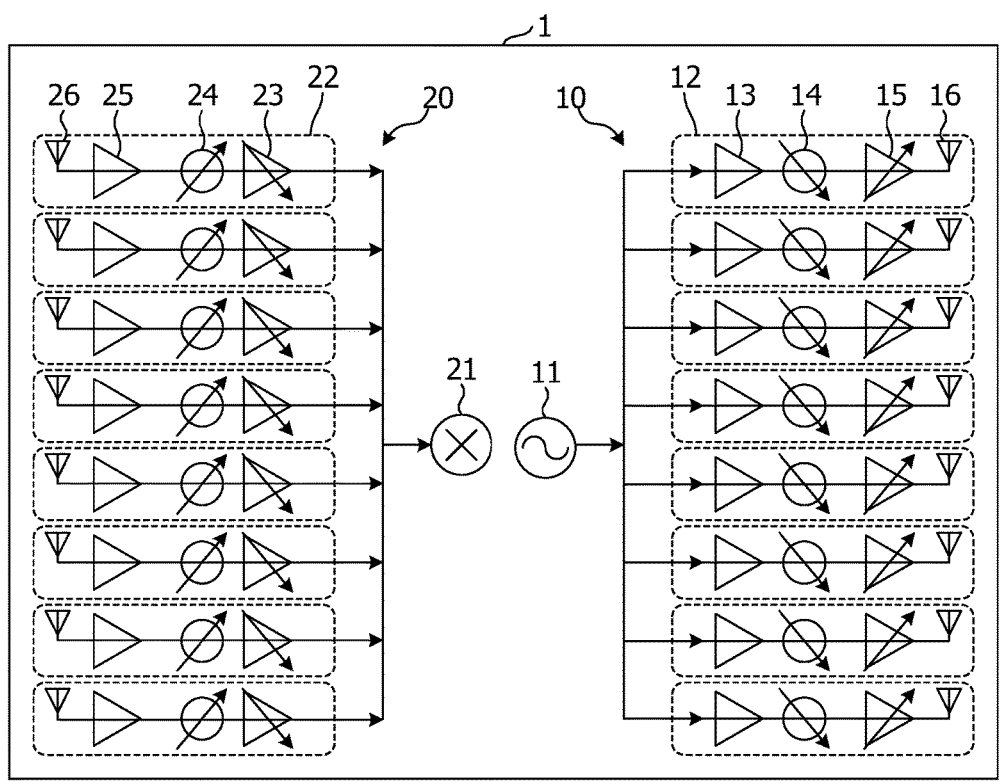
FIG. 1 is a diagram illustrating an example of the configuration of an application system having amplifiers.

FIG. 1 is a diagram illustrating an example of the configuration of an application system 1 having a plurality of amplifiers according to an embodiment. The application system 1 includes a transmitting device 10 and a receiving device 20. Specific examples of the application system 1 are a radio communication system and an array antenna system. The application system 1 may be a system that commonly uses a transmission antenna and a receiving antenna.

The transmitting device 10 includes a transmission signal processing unit 11 and a plurality of transmitters 12. The transmission signal processing unit 11 generates a transmission base signal. The transmission base signal generated by the transmission signal processing unit 11 is distributed to the plurality of transmitters 12.

Each of the plurality of transmitters 12 includes a transmission low noise amplifier 13, a transmission phase shifter 14, a transmission amplifier 15, and a transmission antenna element 16. The transmission low noise amplifier 13 amplifies the distributed transmission base signal. The transmission phase shifter 14 adjusts the phase of the signal amplified by the transmission low noise amplifier 13. The transmission amplifier 15 amplifies the signal with the phase adjusted by the transmission phase shifter 14. The transmission antenna element 16 transmits a radio wave of the signal amplified by the transmission amplifier 15. The plurality of transmission antenna elements 16 is arrayed to form a transmission array antenna.

The receiving device 20 includes a plurality of receivers 22 and a received signal processing unit 21. Each of the plurality of receivers 22 includes a reception antenna element 26, a reception low noise amplifier 25, a reception phase shifter 24, and a reception amplifier 23.

The plurality of reception antenna elements 26 is arrayed to form a reception array antenna. The reception low noise amplifiers 25 amplify signals received by the reception antenna element 26. The reception phase shifters 24 adjust the phases of the signals amplified by the reception low noise amplifiers 25. The reception amplifiers 23 amplify the signals with the phases adjusted by the reception phase shifters 24. The received signal processing unit 21 generates received data by processing signals obtained by combining the signals amplified by the reception amplifiers 23.

The amplifiers according to the present embodiment are applicable to at least one type of the transmission low noise amplifiers 13, the transmission amplifiers 15, the reception low noise amplifiers 25, and the reception amplifiers 23.

Next, the configuration of an amplifier (comparative example) that is compared with the amplifiers according to the present embodiment is described.

Figure 2:
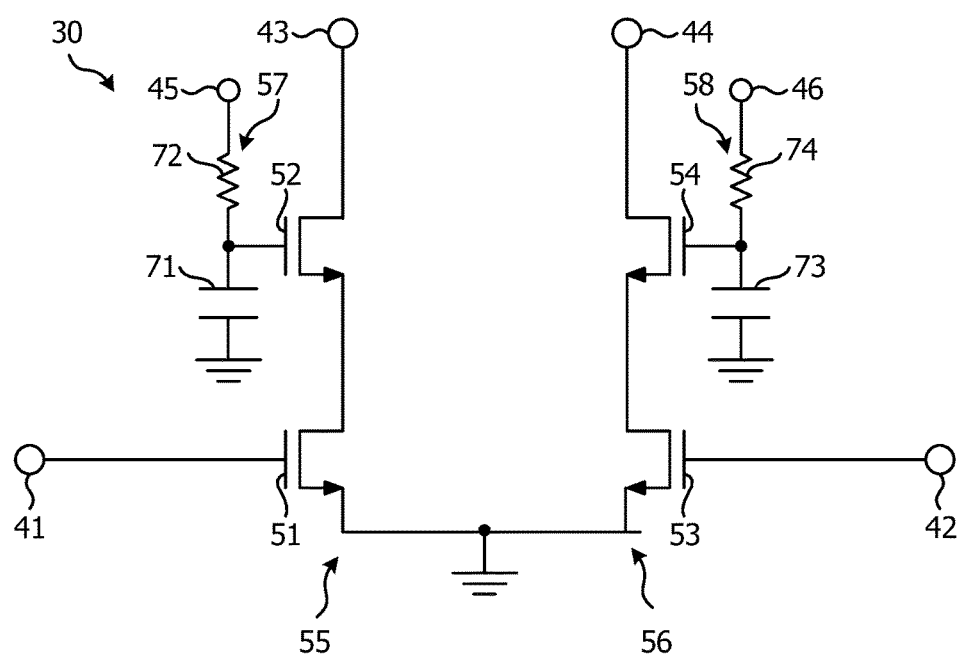
FIG. 2 is a diagram illustrating an example of the configuration of an amplifier (comparative example)

FIG. 2 is a diagram illustrating an example of the configuration of the amplifier 30 that is the comparative example with respect to the amplifiers according to the present embodiment. The amplifier 30 is a differential cascode connection circuit that includes a first cascode connection circuit 55 and a second cascode connection circuit 56 as a differential pair.

The first cascode connection circuit 55 is a first cascode amplifier that includes a first transistor 51 with a grounded common source, a second transistor 52 with a grounded common gate, and a first bias circuit 57. The second transistor 52 is a cascode transistor connected in series to the first transistor 51 serving as an input transistor.

The first transistor 51 is a first common source transistor that has a gate that is an input electrode connected to a first input terminal 41, the source that is a common electrode connected to the ground, and a drain that is an output electrode connected to a source of the second transistor 52.

The second transistor 52 is a first common gate transistor that has the gate that is a common electrode connected to the first bias circuit 57, a source that is an input electrode connected to the drain of the first transistor 51, and a drain that is an output electrode connected to a first output terminal 43.

The first bias circuit 57 is configured to apply a bias voltage to the gate of the second transistor 52. The first bias circuit 57 is a circuit in which a first smoothing capacitor 71 having a terminal connected to the ground is connected to a first resistor 72 having a terminal connected to a first supply terminal 45. A node that connects the other terminal of the smoothing capacitor 71 to the other terminal of the first resistor 72 is connected to the gate of the second transistor 52.

The second cascode connection circuit 56 is a second cascode amplifier that includes a third transistor 53 with a grounded common source, a fourth transistor 54 with a grounded common gate, and a second bias circuit 58. The fourth transistor 54 is a cascode transistor connected in series to the third transistor 53 serving as an input transistor.

The third transistor 53 is a second common source transistor that has a gate that is an input electrode connected to a second input terminal 42, the source that is a common electrode connected to the ground, and a drain that is an output electrode connected to the source of the fourth transistor 54. The source of the third transistor 53 is commonly connected to the source of the first transistor 51.

The fourth transistor 54 is a second common gate transistor that has the gate that is a common electrode connected to the second bias circuit 58, a source that is an input electrode connected to the drain of the third transistor 53, and a drain that is an output electrode connected to a second output terminal 44.

The second bias circuit 58 is configured to apply a bias voltage to the gate of the fourth transistor 54. For example, the second bias circuit 58 is a circuit in which a second smoothing capacitor 73 having a terminal connected to the ground is connected to a second resistor 74 having a terminal connected to the second supply terminal 46. A node that connects the other terminal of the second smoothing capacitor 73 to the other terminal of the second resistor 74 is connected to the gate of the fourth transistor 54.

A pair of the input terminals, which are the first input terminal 41 and the second input terminal 42, are differential input terminals to which differential signals are input. A pair of the output terminals, which are the first output terminal 43 and the second output terminal 44, are differential output terminals from which the differential signals are output. In addition, fixed power-supply voltages whose values are equal to each other are input to the first supply terminal 45 and the second supply terminal 46.

Next, the configurations of the amplifiers according to the present embodiment are described.

Figure 3:
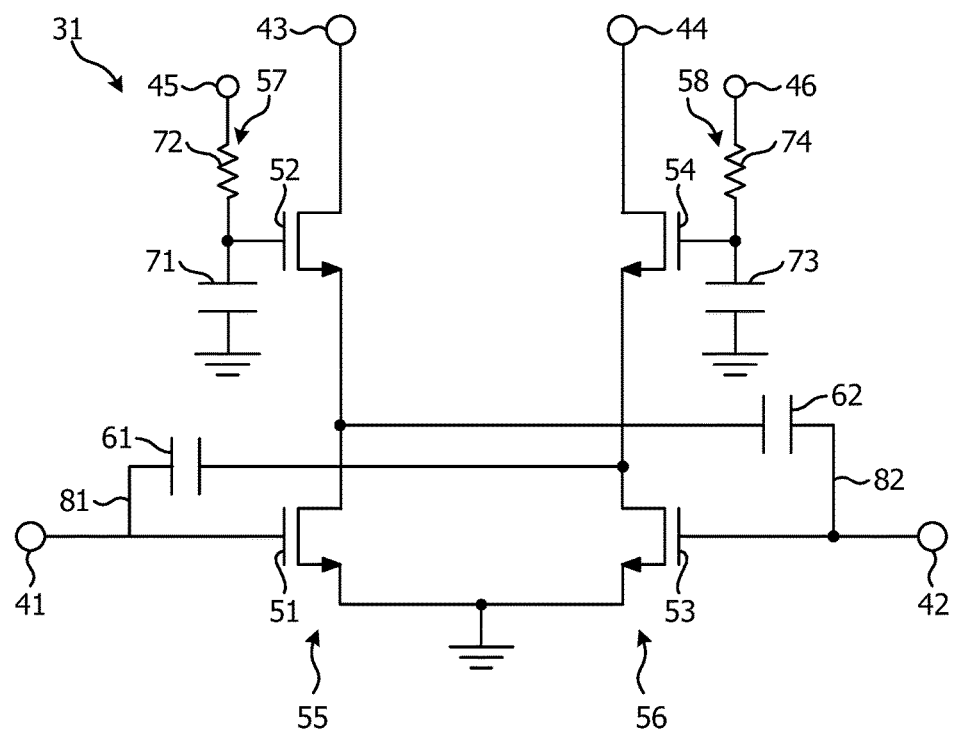
FIG. 3 is a diagram illustrating an example of the configuration of an amplifier according to a first embodiment.

FIG. 3 is a diagram illustrating an example of the configuration of an amplifier 31 according to a first embodiment. The amplifier 31 includes a first cascode connection circuit 55, a second cascode connection circuit 56, a first feedback path 81, and a second feedback path 82. Specifically, the amplifier 31 is a circuit formed by adding the first feedback path 81 and the second feedback path 82 to the comparative example illustrated in FIG. 2.

The first feedback path 81 is a circuit having a first capacitor 61 and feeds output from the drain of the third transistor 53 back to the gate of the first transistor 51 via the first capacitor 61. The first capacitor 61 is an example of a capacitative element connected in series between the drain of the third transistor 53 and the gate of the first transistor 51. The first feedback path 81 is an example of a path on which an output terminal (drain) of the third transistor 53 is connected to an input terminal (gate) of the first transistor 51 via the first capacitor 61.

The second feedback path 82 is a circuit having a second capacitor 62 and feeds output from the drain of the first transistor 51 back to the gate of the third transistor 53 via the second capacitor 62. The second capacitor 62 is an example of a capacitative element connected in series between the drain of the first transistor 51 and the gate of the third transistor 53. The second feedback path 82 is an example of a path on which an output terminal (drain) of the first transistor 51 is connected to an input terminal (gate) of the third transistor 53 via the second capacitor 62.

Figure 4:
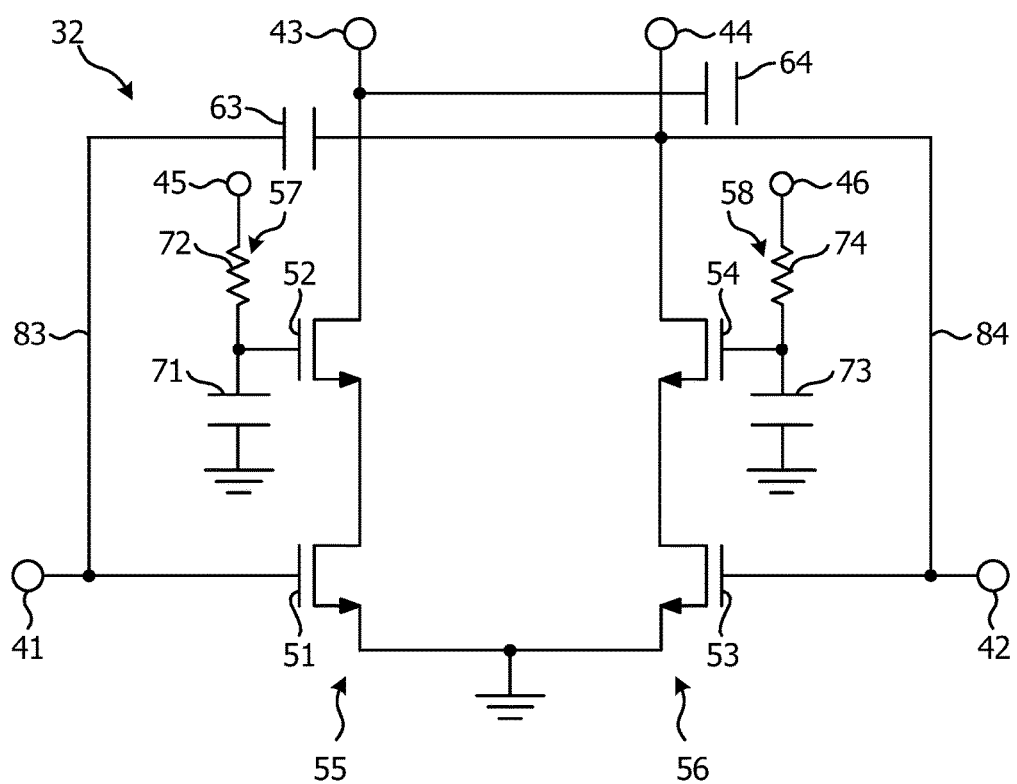
FIG. 4 is a diagram illustrating an example of the configuration of an amplifier according to a second embodiment.

FIG. 4 is a diagram illustrating an example of the configuration of an amplifier 32 according to a second embodiment. The amplifier 32 includes the first cascode connection circuit 55, the second cascode connection circuit 56, a third feedback path 83, and a fourth feedback path 84. Specifically, the amplifier 32 is a circuit formed by adding the third feedback path 83 and the fourth feedback path 84 to the comparative example illustrated in FIG. 2.

The third feedback path 83 is a circuit having a third capacitor 63 and feeds output from the drain of the fourth transistor 54 back to the gate of the first transistor 51 via the third capacitor 63. The third capacitor 63 is an example of a capacitative element connected in series between the drain of the fourth transistor 54 and the gate of the first transistor 51. The third feedback path 83 is an example of a path on which an output terminal (drain) of the fourth transistor 54 is connected to the input terminal (gate) of the first transistor 51 via the third capacitor 63.

The fourth feedback path 84 is a circuit having a fourth capacitor 64 and feeds output from the drain of the second transistor 52 back to the gate of the third transistor 53 via the fourth capacitor 64. The fourth capacitor 64 is an example of a capacitative element connected in series between the drain of the second transistor 52 and the gate of the third transistor 53. The fourth feedback path 84 is an example of a path on which an output terminal (drain) of the second transistor 52 is connected to the input terminal (gate) of the third transistor 53 via the fourth capacitor 64.

Figure 5:
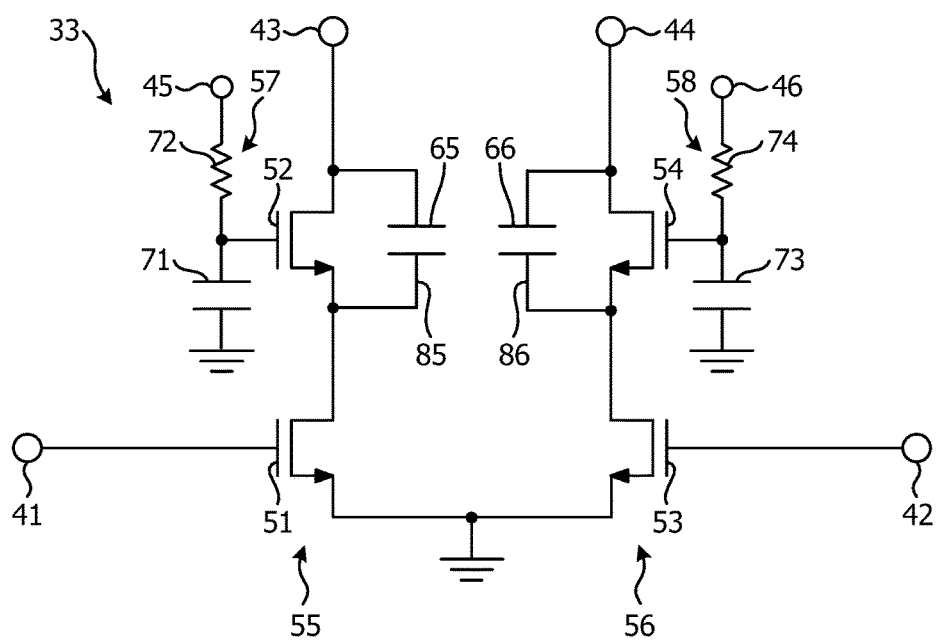
FIG. 5 is a diagram illustrating an example of the configuration of an amplifier according to a third embodiment.

FIG. 5 is a diagram illustrating an example of the configuration of an amplifier 33 according to a third embodiment. The amplifier 33 includes the first cascode connection circuit 55, the second cascode connection circuit 56, a fifth feedback path 85, and a sixth feedback path 86. Specifically, the amplifier 33 is a circuit formed by adding the fifth feedback 85 and the sixth feedback path 86 to the comparative example illustrated in FIG. 2.

The fifth feedback path 85 is a circuit having a fifth capacitor 65 and feeds output from the drain of the second transistor 52 back to the source of the second transistor 52 via the capacitor 65. The fifth capacitor 65 is an example of a capacitative element connected in series between the drain of the second transistor 52 and the source of the second transistor 52. The fifth feedback path 85 is an example of a path on which the output terminal (drain) of the second transistor 52 is connected to an input terminal (source) of the second transistor 52 via the fifth capacitor 65.

The sixth feedback path 86 is a circuit having a sixth capacitor 66 and feeds output from the drain of the fourth transistor 54 back to the source of the fourth transistor 54 via the sixth capacitor 66. The sixth capacitor 66 is an example of a capacitative element connected in series between the drain of the fourth transistor 54 and the source of the fourth transistor 54. The sixth feedback path 86 is an example of a path on which the output terminal (drain) of the fourth transistor 54 is connected to an input terminal (source) of the fourth transistor 54 via the sixth capacitor 66.

Figure 6:
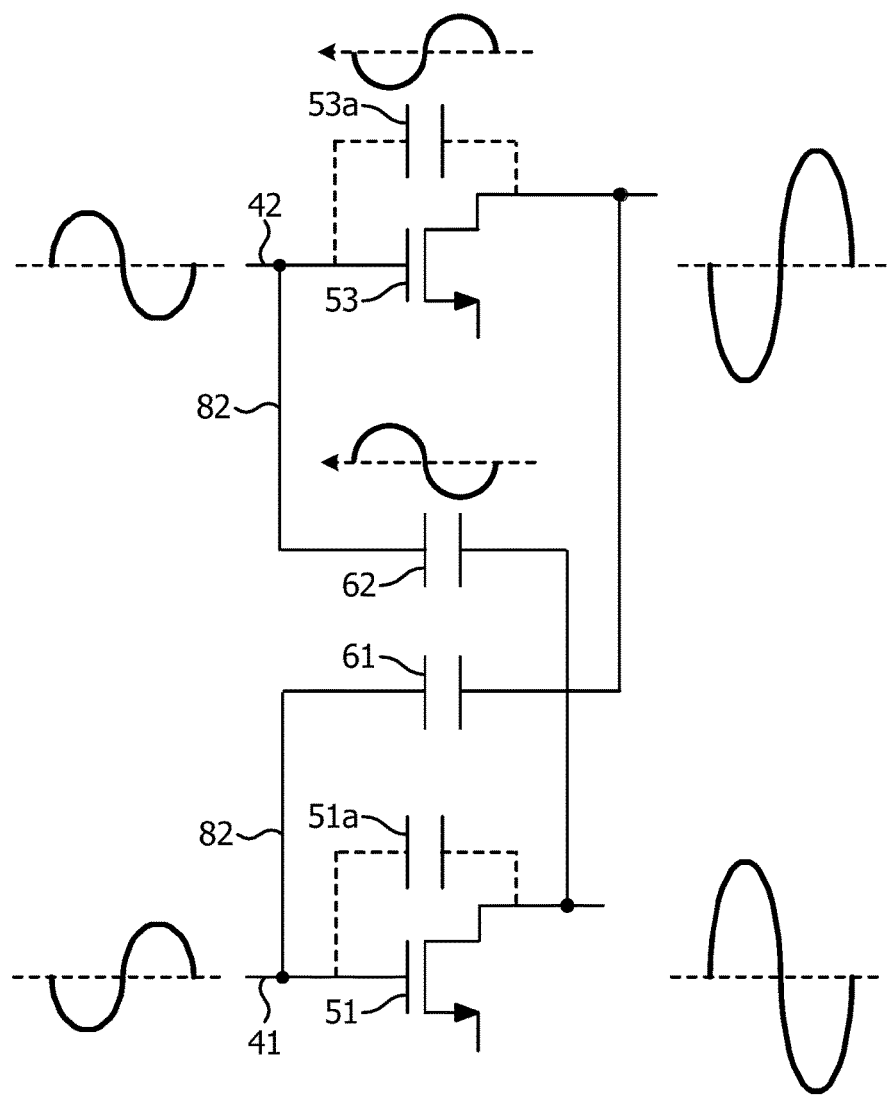
FIG. 6 is a diagram illustrating the configuration of a neutralized differential source common circuit that is a lower portion of the amplifier according to the first embodiment.

FIG. 6 is a diagram illustrating the configuration of a neutralized differential source common circuit that is a lower portion of the amplifier according to the first embodiment. A pair of differential signals is input to the gate of the first transistor 51 and the gate of the third transistor 53. One of the differential signals is input to the gate of the first transistor 51 via the first input terminal 41, while the other of the differential signals is input to the gate of the third transistor 53 via the second input terminal 42.

When the one of the pair of differential signals is input to the gate of the first transistor 51, the one signal is amplified by the first transistor 51. Thus, the signal (the one inverted signal) with the phase inverted from the one signal and the amplitude amplified from the one signal is output from the drain of the first transistor 51. When the one inverted signal is input to the second capacitor 62, the signal with the same phase as the one inverted signal and the amplitude attenuated from the one inverted signal is fed back to the gate of the third transistor 53.

When the other of the pair of differential signals is input to the gate of the third transistor 53, the other signal is amplified by the third transistor 53. Thus, the signal (the other inverted signal) with the phase inverted from the other signal and the amplitude amplified from the other signal is output from the drain of the third transistor 53. When the other inverted signal is input to a parasitic feedback capacitance 53a, the signal with the same phase as the other inverted signal and the amplitude attenuated from the other inverted signal is fed back to the gate of the third transistor 53. The parasitic feedback capacitance 53a is a parasitic capacitance between the gate and drain of the third transistor 53.

Thus, the signal fed from the drain of the third transistor 53 via the parasitic feedback capacitance 53a is attenuated by the signal fed from the drain of the first transistor 51 via the second capacitor 62. Thus, the parasitic feedback capacitance 53a may suppress a reduction in the gain of the third transistor 53. Similarly, a parasitic feedback capacitance 51a may suppress a reduction in the gain of the first transistor 51 due to the presence of the first capacitor 61. The parasitic feedback capacitance 51a is a parasitic capacitance between the gate and drain of the first transistor 51.

Figure 7:
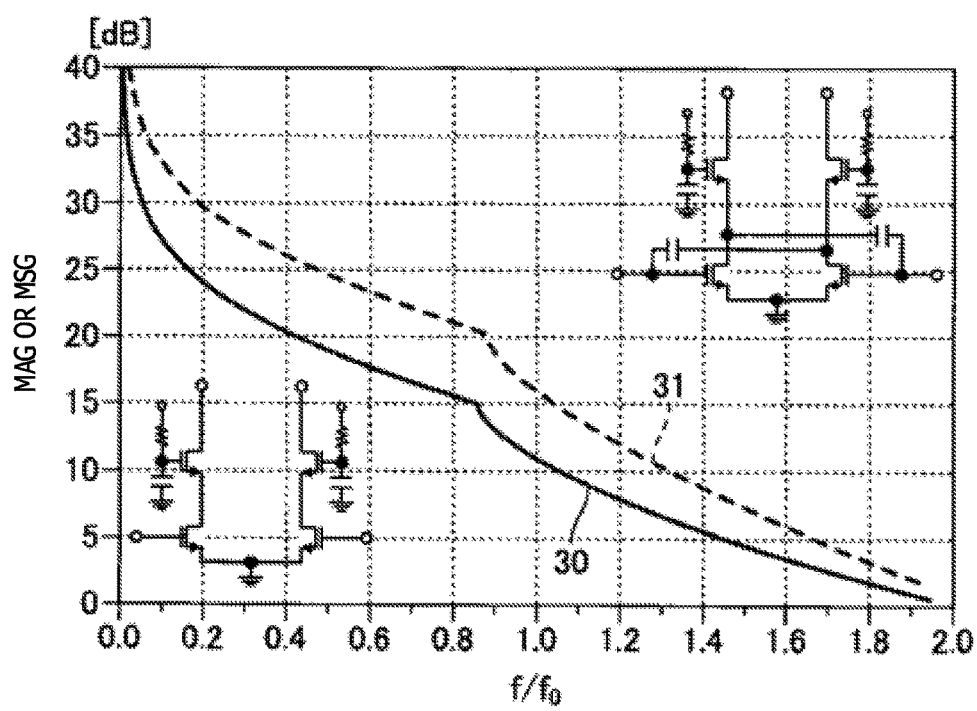
FIG. 7 is a diagram illustrating an example of the gain of the amplifier according to the comparative example and the gain of the amplifier according to the first embodiment.
Figure 8:
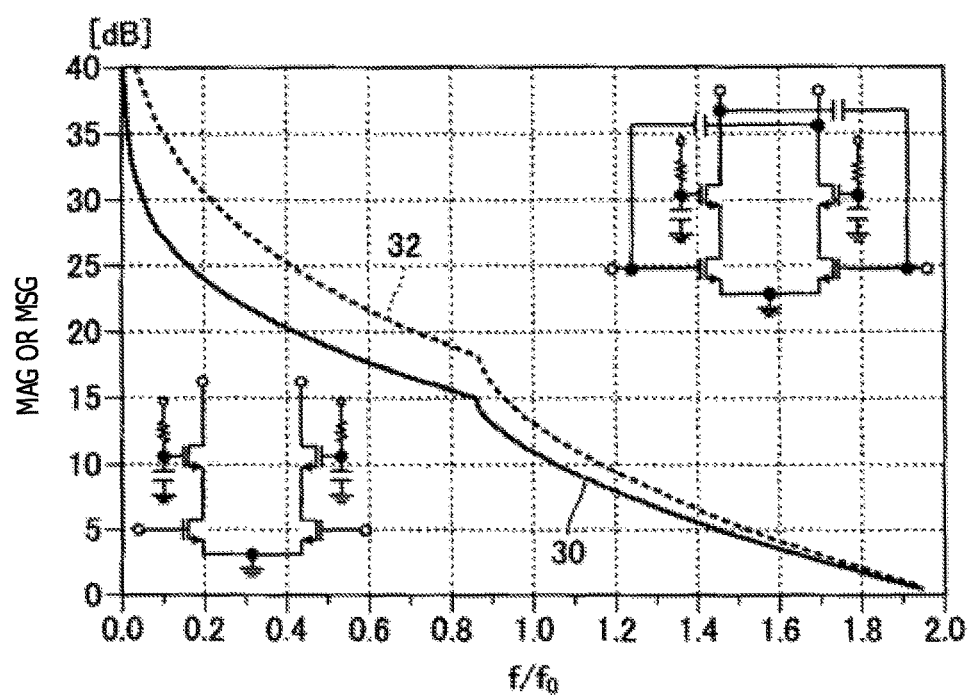
FIG. 8 is a diagram illustrating an example of the gain of the amplifier according to the comparative example and the gain of the amplifier according to the second embodiment.

FIG. 7 is a diagram illustrating an example of the gain of the amplifier 30 according to the comparative example and the gain of the amplifier 31 according to the first embodiment. FIG. 8 is a diagram illustrating an example of the gain of the amplifier 30 according to the comparative example and the gain of the amplifier 32 according to the second embodiment. FIGS. 7 and 8 illustrate the gains obtained when signals are input to the first and second input terminals 41 and 42 and output from the third and fourth terminals 43 and 44.

In addition, FIGS. 7 and 8 illustrate the results of circuit simulation using actual CMOS transistor models and indicate a case where the sizes of the transistors used in the amplifiers are the same in order to compare the gains under the same conditions. The same applies to drawings illustrating gains and described later.

The ordinate axes indicate the maximum available gain (MAG) or the maximum stable gain (MSG) (refer to Equations (1) to (3)). The abscissa axes indicate a normalized frequency (f/f$_0$). The normalized frequency is a value normalized with a standard frequency f$_0$ (of, for example, 60 GHz) in an EHF band, while f indicates operational frequencies of the amplifiers.

[Math. 1]

$$MAG = \left|\frac{S_{21}}{S_{12}}\right|\left(K - \sqrt{K^2 - 1}\right) \quad (1)$$

$$MSG = \left|\frac{S_{21}}{S_{12}}\right| \quad (2)$$

$$K = \frac{1 + |S_{11}S_{22} - S_{21}S_{12}|^2 - |S_{11}|^2 - |S_{22}|^2}{2|S_{12}S_{21}|} \quad (3)$$

The MAG is a gain defined when a stable coefficient K is equal to or larger than 1, and the MSG is a gain defined when the stable coefficient K is smaller than 1. $S_{11}$, $S_{12}$, $S_{21}$, and $S_{22}$ indicate S-parameters.

Since the connection configurations of the transistors of the amplifiers 31 and 32 are the same as that of the transistors of the amplifier 30, power to be consumed by each of the amplifiers 31 and 32 is equal to power to be consumed by the amplifier 30. Specifically, when the gains of the amplifiers are high, gains (gain efficiencies with respect to consumed power) per unit power consumed by the amplifiers are high. As is apparent from FIGS. 7 and 8, the gains of the amplifiers 31 and 32 are higher than the gain of the amplifier 30 for all frequencies.

When the normalized frequency is 1, the gain (gain efficiency with respect to consumed power) of the amplifier 30 per unit power is 1.29 dB/mW. When the normalized frequency is 1, the gain (gain efficiency with respect to consumed power) of the amplifier 31 per unit power is 1.87 dB/mW and the gain (gain efficiency with respect to consumed power) of the amplifier 32 per unit power is 1.55 dB/mW. Thus, the amplifiers 31 and 32 may achieve higher gains with the same consumed power, compared with the amplifier 30. In other words, the amplifiers 31 and 32 may achieve high gains with low consumed power.

Figure 9:
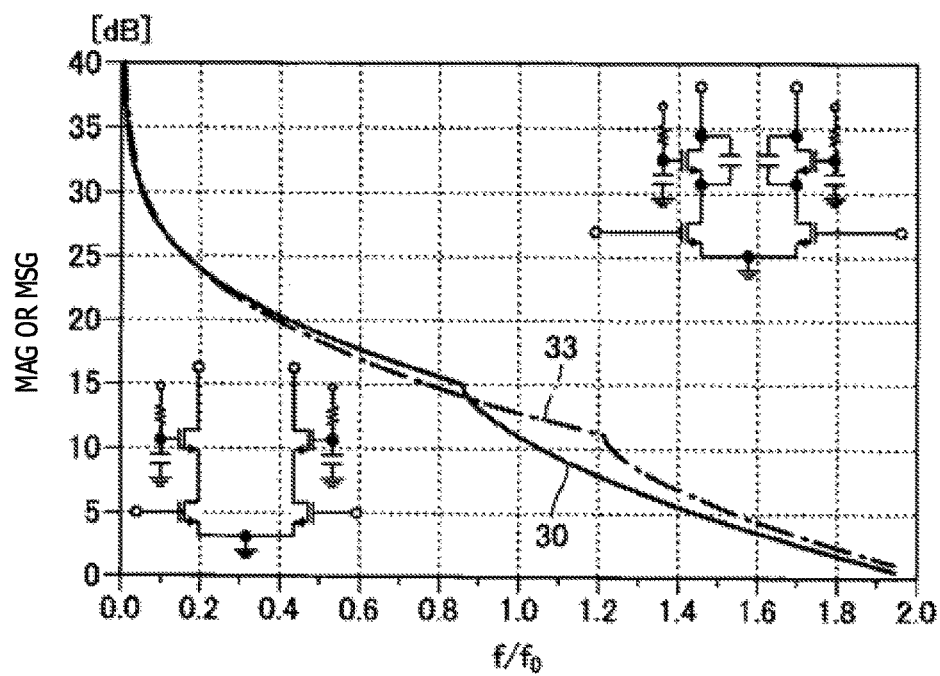
FIG. 9 is a diagram illustrating an example of the gain of the amplifier according to the comparative example and the gain of the amplifier according to the third embodiment.

FIG. 9 is a diagram illustrating an example of the gain of the amplifier 30 according to the comparative example and the gain of the amplifier 33 according to the third embodiment. FIG. 9 illustrate the gains obtained when signals are input to the first and second input terminals 41 and 42 and output from the first and second output terminals 43 and 44.

Since the connection configuration of the transistors of the amplifier 33 is the same as that of the transistors of the amplifier 30, power to be consumed by the amplifier 33 is equal to power to be consumed by the amplifier 30. Referring to FIG. 9, while the gain of the amplifier 30 is higher than the gain of the amplifier 33 in a frequency region lower than a certain frequency, the gain of the amplifier 33 is higher than the gain of the amplifier 30 in a frequency region higher than the certain frequency. In other words, the gain efficiency of the amplifier 33 with respect to consumed power is higher than the gain efficiency of the amplifier 30 with respect to consumed power in the frequency region higher than the certain frequency.

When the normalized frequency is 1, the gain (gain efficiency with respect to consumed power) of the amplifier 30 per unit power is 1.29 dB/mW. When the normalized frequency is 1, the gain of the amplifier 33 per unit power is 1.50 dB/mW. Thus, the amplifier 33 may achieve a higher gain with the same consumed power, compared with the amplifier 30. In other words, the amplifier 33 may achieve a high gain with low consumed power.

Figure 10:
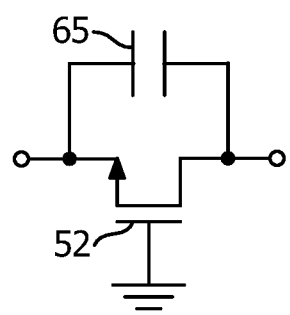
FIG. 10 is a diagram illustrating an example of a circuit in which a second transistor with a common gate is connected to a fifth capacitor.
Figure 11:
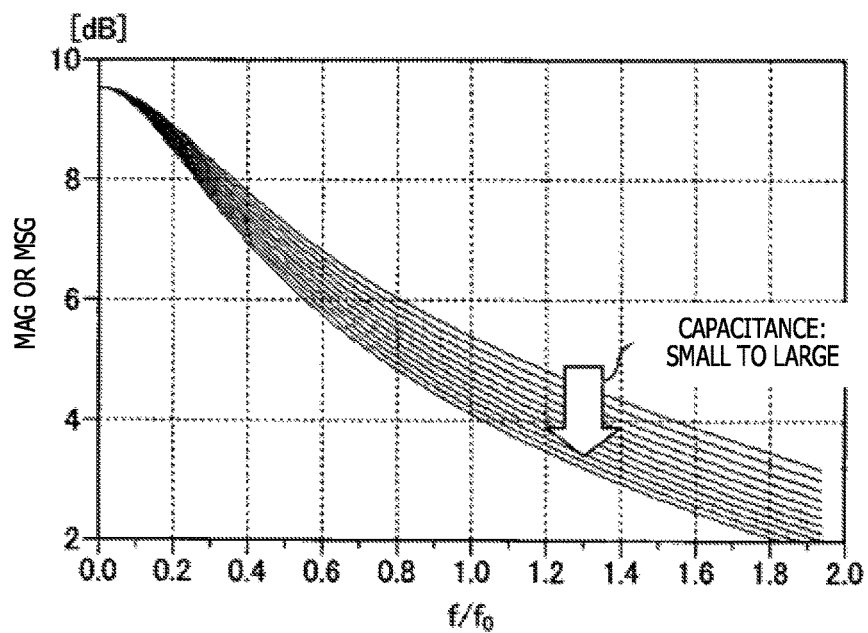
FIG. 11 is a diagram illustrating an example of the gain of the circuit illustrated in FIG. 10.

FIG. 10 is a diagram illustrating an example of a circuit in which the second transistor 52 with the common gate is connected to the fifth capacitor 65. The circuit illustrated in FIG. 10 is a partial circuit of the amplifier 33. FIG. 11 is a diagram illustrating an example of the gain of the circuit illustrated in FIG. 10. FIG. 11 illustrates the gain obtained when a signal is input to the source of the second transistor 52 illustrated in FIG. 10 and output from the drain of the second transistor 52. As illustrated in FIG. 11, as the capacitance of the fifth capacitor 65 is increased, the gain tends to decrease.

Figure 12:
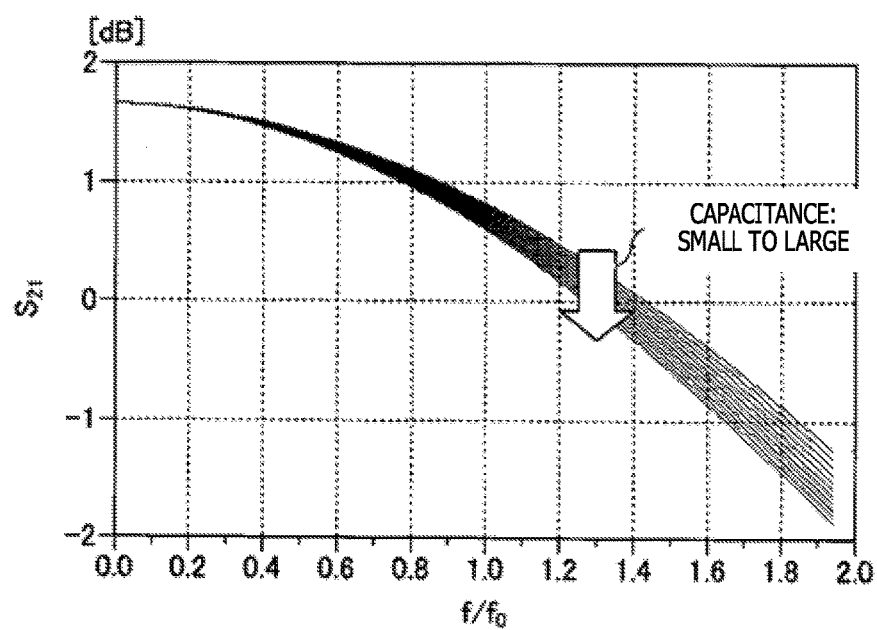
FIG. 12 is a diagram illustrating an example of $S_{21}$ characteristics of the circuit illustrated in FIG. 10.
Figure 13:
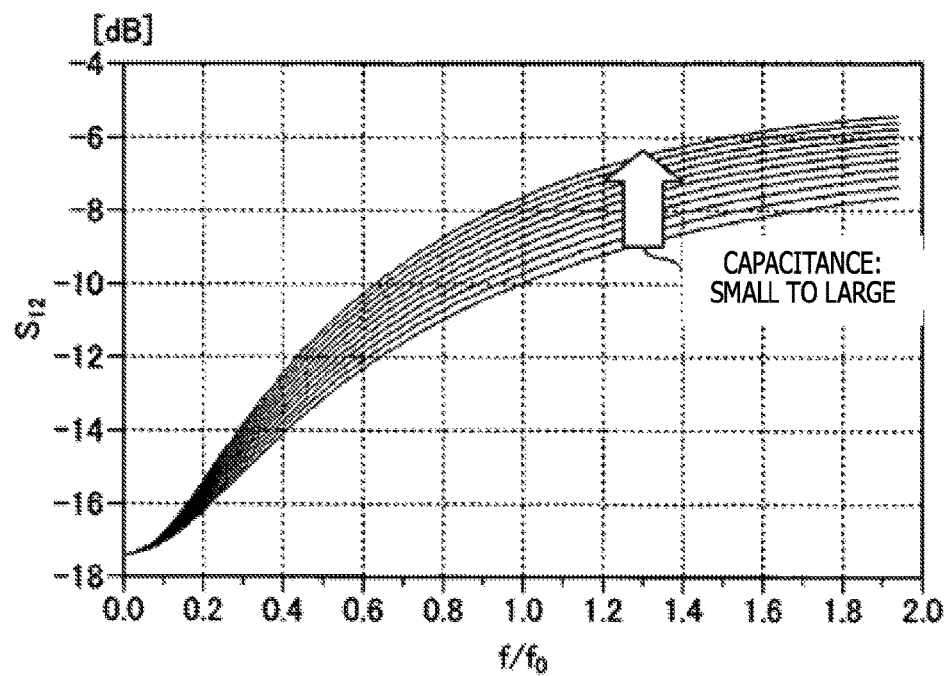
FIG. 13 is a diagram illustrating an example of $S_{12}$ characteristics of the circuit illustrated in FIG. 10.
Figure 14:
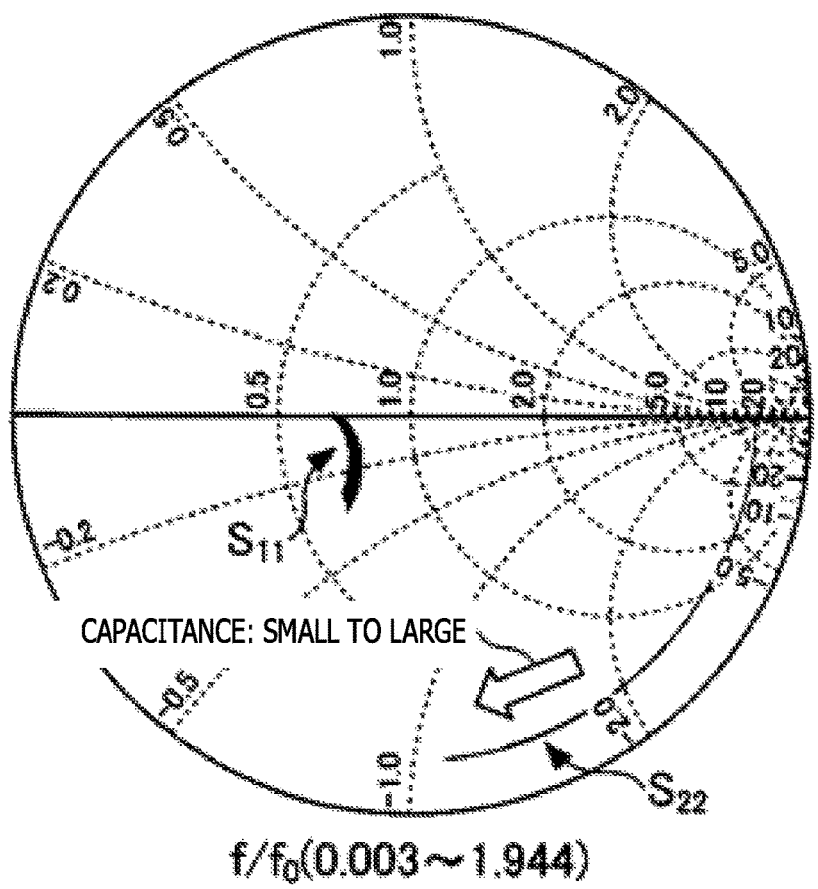
FIG. 14 is a Smith chart illustrating an example of $S_{11}$ and $S_{22}$ characteristics of the circuit illustrated in FIG. 10.
Figure 15:
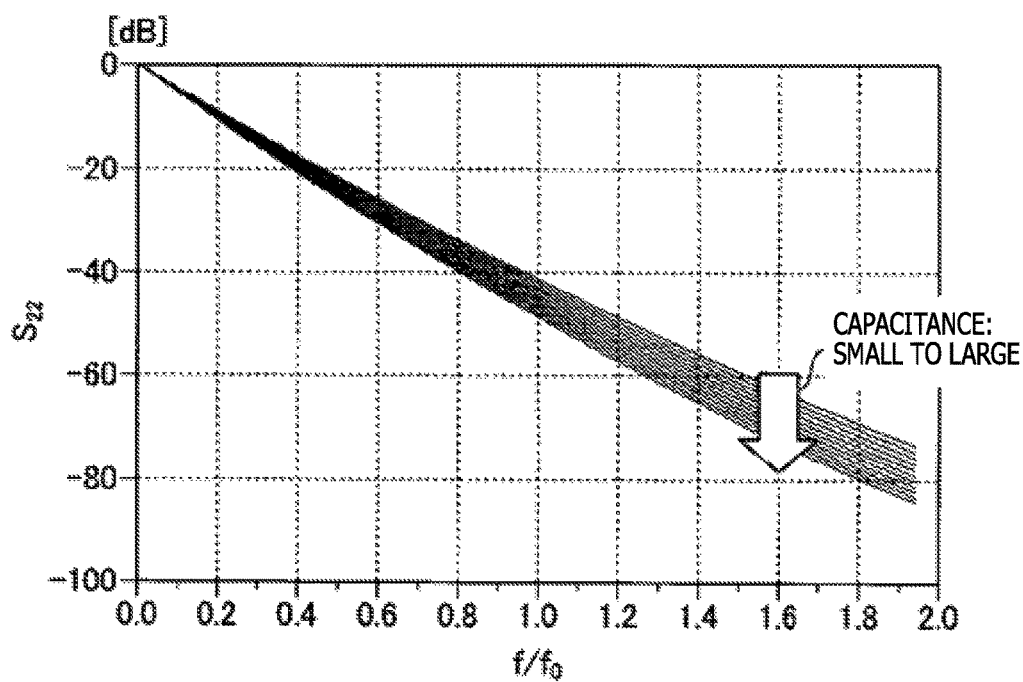
FIG. 15 is a diagram illustrating an example of the $S_{22}$ characteristics of the circuit illustrated in FIG. 10.

FIG. 12 is a diagram illustrating an example of $S_{21}$ characteristics of the circuit illustrated in FIG. 10. $S_{21}$ indicates a transfer coefficient (gain) in a positive direction (direction from input to output) of the circuit. When the capacitance of the fifth capacitor 65 is increased, $S_{21}$ slightly decreases. FIG. 13 is a diagram illustrating an example of $S_{12}$ characteristics of the circuit illustrated in FIG. 10. $S_{12}$ indicates a transfer coefficient in an opposite direction (direction from output to input) of the circuit. When the capacitance of the fifth capacitor 65 is increased, $S_{12}$ increases. FIG. 14 is a Smith chart of the circuit illustrated in FIG. 10. $S_{11}$ indicates an input reflection coefficient of the circuit. $S_{22}$ indicates an output reflection coefficient of the circuit. FIG. 15 is a diagram illustrating an example of $S_{22}$ characteristics of the circuit illustrated in FIG. 10. When the capacitance of the fifth capacitor 65 is increased, the amplitude of $S_{22}$ changes very little (refer to FIG. 14) and only the phase of $S_{22}$ changes (refer to FIG. 15).

Figure 16:
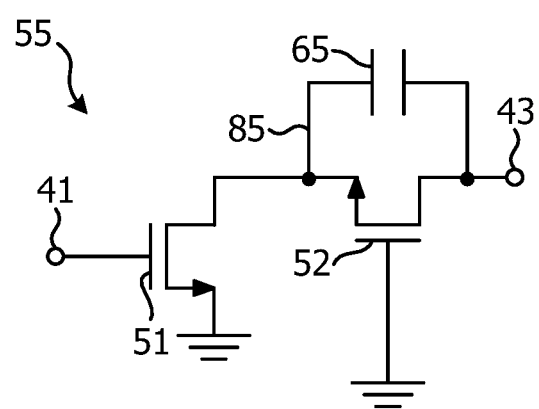
FIG. 16 is a diagram illustrating an example of a first cascode connection circuit located on one side of the differential amplifier.
Figure 17:
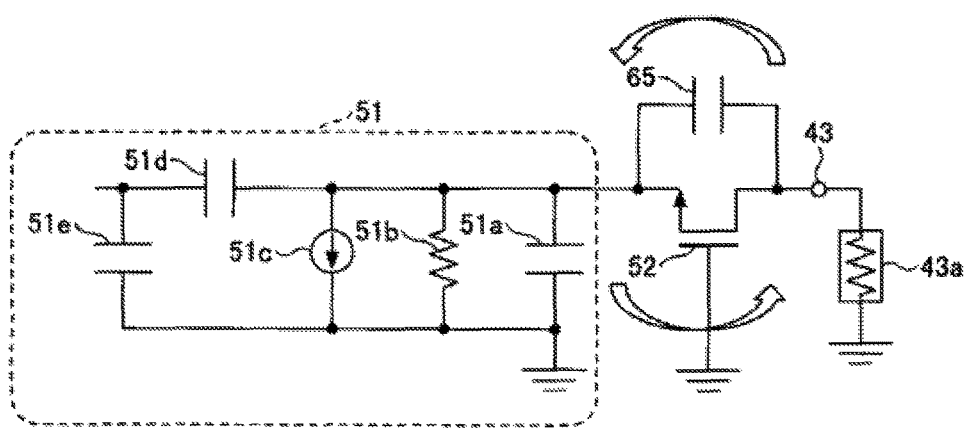
FIG. 17 is a diagram illustrating a circuit equivalent to the circuit illustrated in FIG. 16.
Figure 18:
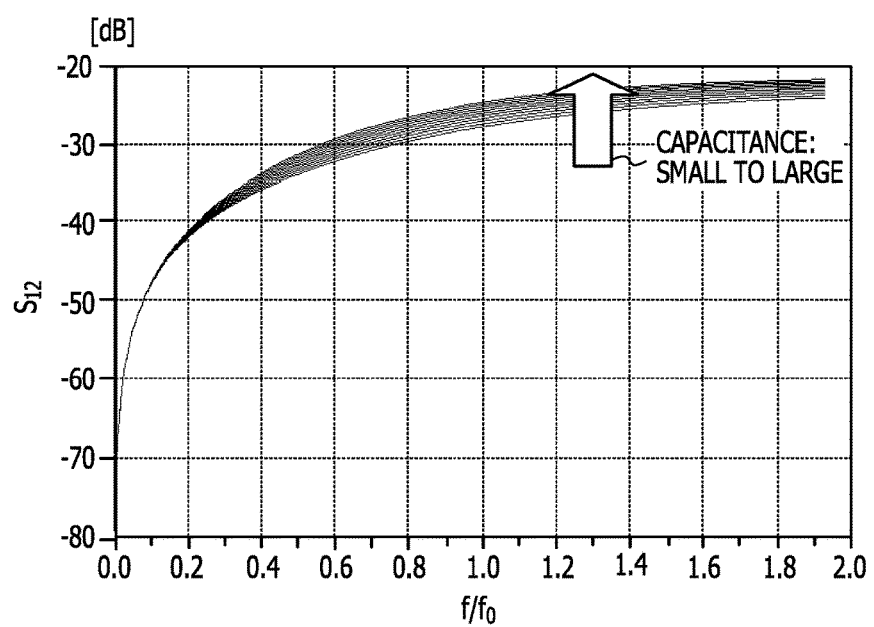
FIG. 18 is a diagram illustrating an example of $S_{12}$ characteristics of the circuit illustrated in FIG. 16.
Figure 19:
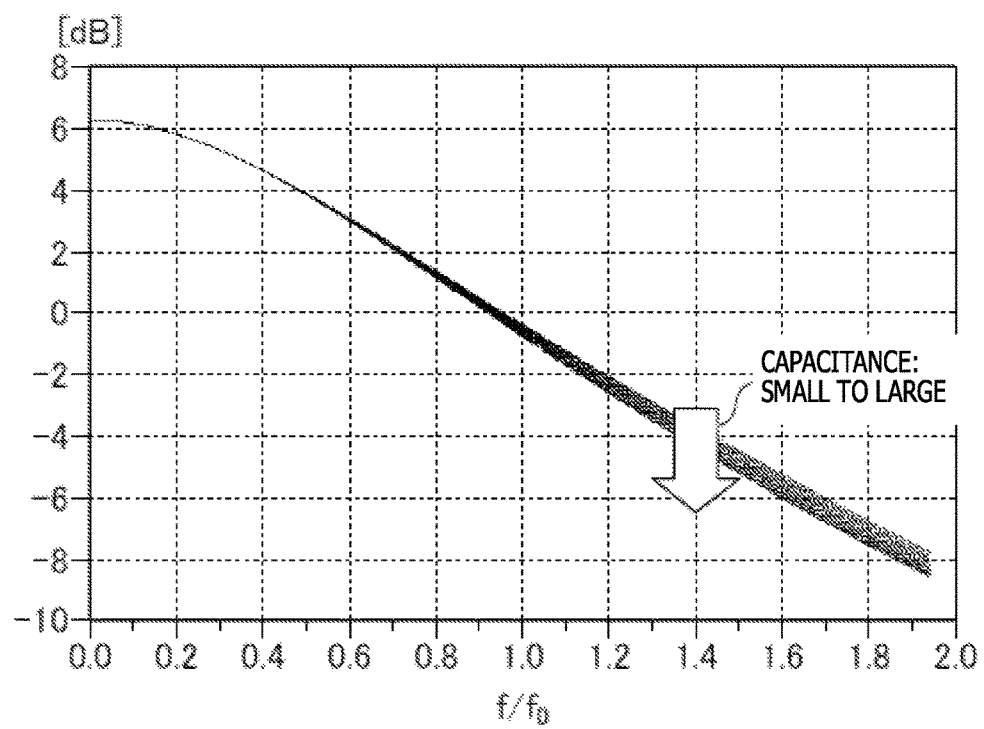
FIG. 19 is a diagram illustrating an example of $S_{21}$ characteristics of the circuit illustrated in FIG. 16.

FIG. 16 is a diagram illustrating an example of the configuration of the first cascode connection circuit 55 located on the one side of the differential amplifier 33. FIG. 17 is a diagram illustrating a circuit equivalent to the circuit illustrated in FIG. 16. The first transistor 51 with the common source may be achieved by capacitors 51a, 51e, and 51d, a resistor 51b, and a fixed current 51c. FIG. 18 is a diagram illustrating an example of $S_{12}$ characteristics of the circuit illustrated in FIG. 16. FIG. 18 illustrates $S_{12}$ obtained when a signal is input to the first input terminal 41 and output from the first output terminal 43. When the capacitance of the fifth capacitor 65 is increased, $S_{12}$ increases. FIG. 19 is a diagram illustrating an example of $S_{21}$ characteristics of the circuit illustrated in FIG. 16. When the capacitance of the fifth capacitor 65 is increased, $S_{21}$ is slightly decreases.

Figure 20:
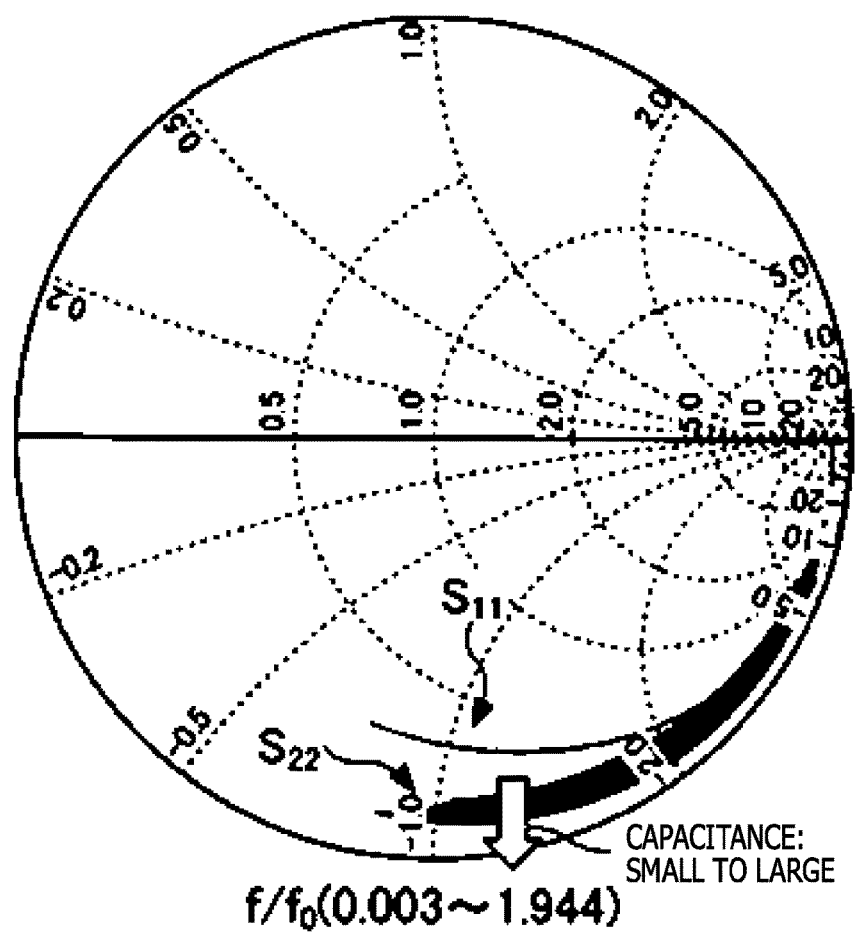
FIG. 20 is a Smith chart illustrating an example of $S_{11}$ and $S_{22}$ characteristics of the circuit illustrated in FIG. 16.
Figure 21:
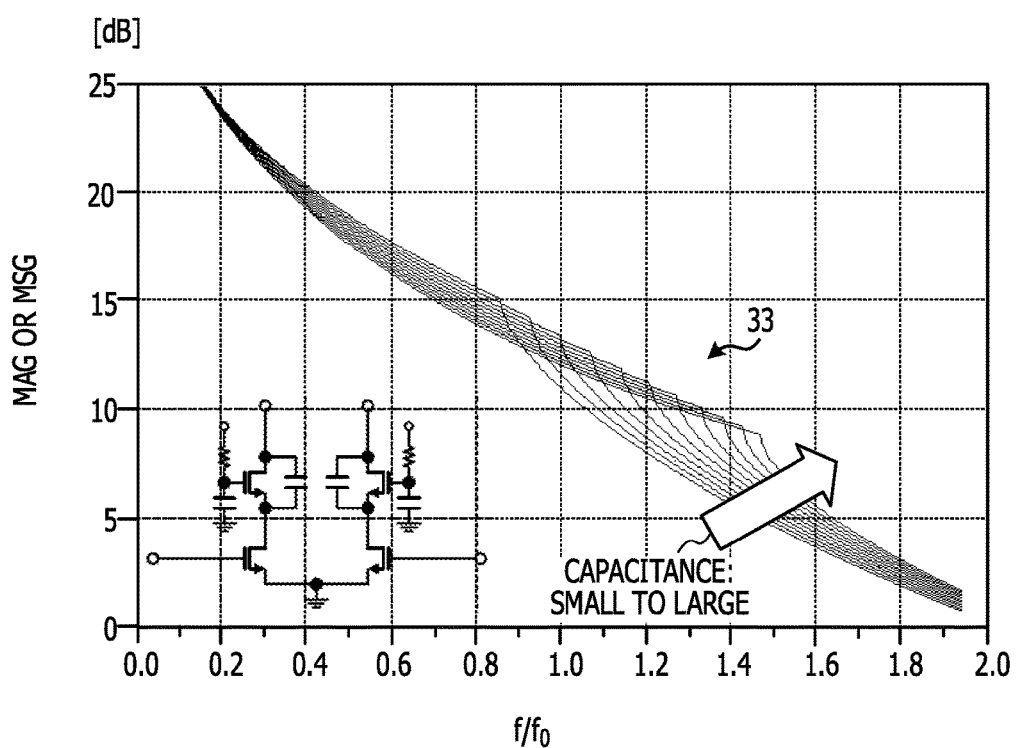
FIG. 21 is a characteristic diagram illustrating the gain of the circuit illustrated in FIG. 16.

FIG. 20 is a Smith chart of the circuit illustrated in FIG. 16. FIG. 21 is a characteristic diagram illustrating the gain of the circuit illustrated in FIG. 16. FIGS. 20 and 21 illustrate characteristics obtained when a signal is input to the first input terminal 41 and output from the first output terminal 43.

As illustrated in FIGS. 16 and 17, the first transistor 51 with the common source exists on the input side of the second transistor 52 with the common gate. Thus, a reflection coefficient (output capacity of the first transistor 51) for an input load of the second transistor 52 is high for the existence of the first transistor 51. Thus, the reflection coefficient $S_{22}$ of the last output may be increased due to the feedback by the fifth capacitor 65 (or $S_{22}$ is shifted to the outside of the Smith chart illustrated in FIG. 20). Thus, as illustrated in FIG. 21, the MAG of the circuit illustrated in FIG. 16 increases.

Figure 22:
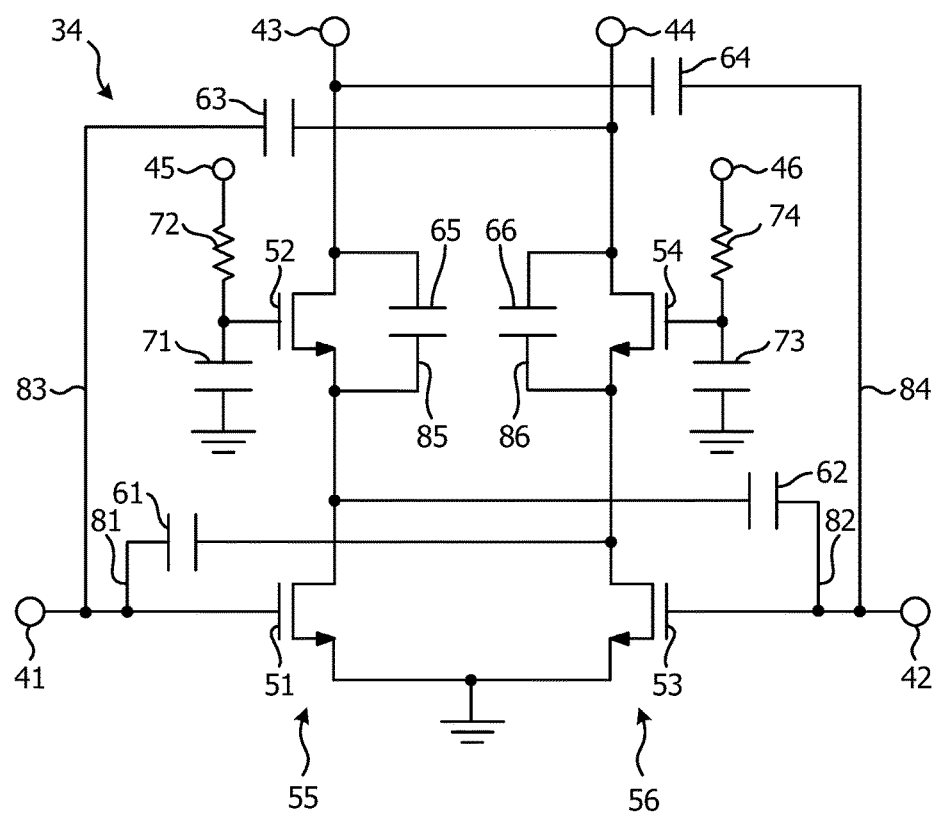
FIG. 22 is a diagram illustrating an example of the configuration of an amplifier according to a fourth embodiment.

FIG. 22 is a diagram illustrating an example of the configuration of an amplifier 34 according to a fourth embodiment. The amplifier 34 is a circuit formed by adding the feedback paths 81 and 82 of the amplifier 31, the feedback paths 83 and 84 of the amplifier 32, and the feedback paths 85 and 86 of the amplifier 33 to the configuration of the amplifier 30 according to the comparative example.

Figure 23:
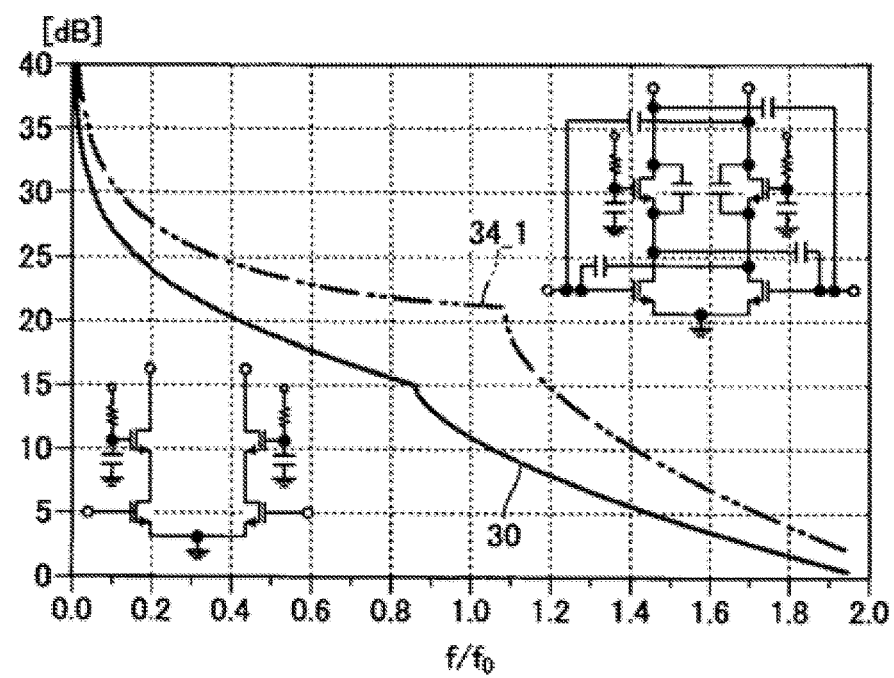
FIG. 23 is a diagram illustrating a first case of gain characteristics of the amplifier according to the fourth embodiment.
Figure 24:
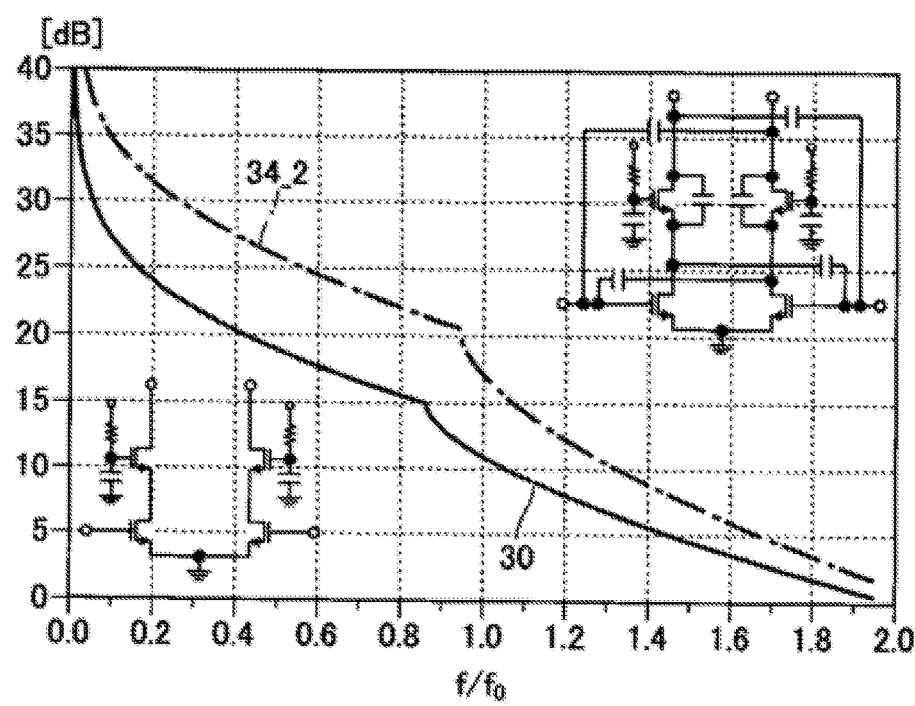
FIG. 24 is a diagram illustrating a second case of the gain characteristics of the amplifier according to the fourth embodiment.

FIG. 23 is a diagram illustrating a first case 34_1 of gain characteristics of the amplifier 34. FIG. 24 is a diagram illustrating a second case 34_2 of the gain characteristics of the amplifier 34. FIGS. 23 and 24 illustrate gains obtained when signals are input to the first and second input terminals 41 and 42 and output from the first and second output terminals 43 and 44.

Values of feedback capacitances (capacitors 61 to 66) of three types in the first case 34_1 are different from values of the feedback capacitances (capacitors 61 to 66) of the three types in the second case 34_2. The values of the capacities in the second case 34_2 are smaller than the values of the capacities in the first case 34_1. Specifically, the values of the feedback capacitances of the capacitors 61 and 62 are reduced by approximately 9%, the values of the feedback capacitances of the capacitors 63 and 64 are reduced by approximately 29%, and the values of the feedback capacitances of the capacitors 65 and 66 are reduced by 25%.

In the two cases, the gains are higher than the gain of the amplifier 30. Since the connection configuration of the transistors of the amplifier 34 is the same as that of the transistors of the amplifier 30, power consumed by the amplifier 34 is equal to power consumed by the amplifier 30. Specifically, the gain of the amplifier 34 per unit power is higher than the gain of the amplifier 30 per unit power.

When the normalized frequency is 1, the gain (gain efficiency with respect to consumed power) of the amplifier 30 per unit power is 1.29 dB/mW. When the normalized frequency is 1, the gain (gain efficiency with respect to consumed power) of the amplifier 34 per unit power is 2.5 dB/mW in the first case and is 2.0 dB/mW in the second case. Thus, the amplifier 34 may achieve a higher gain with the same consumed power, compared with the amplifier 30. In other words, the amplifier 34 may achieve a high gain with low consumed power.

Figure 25:
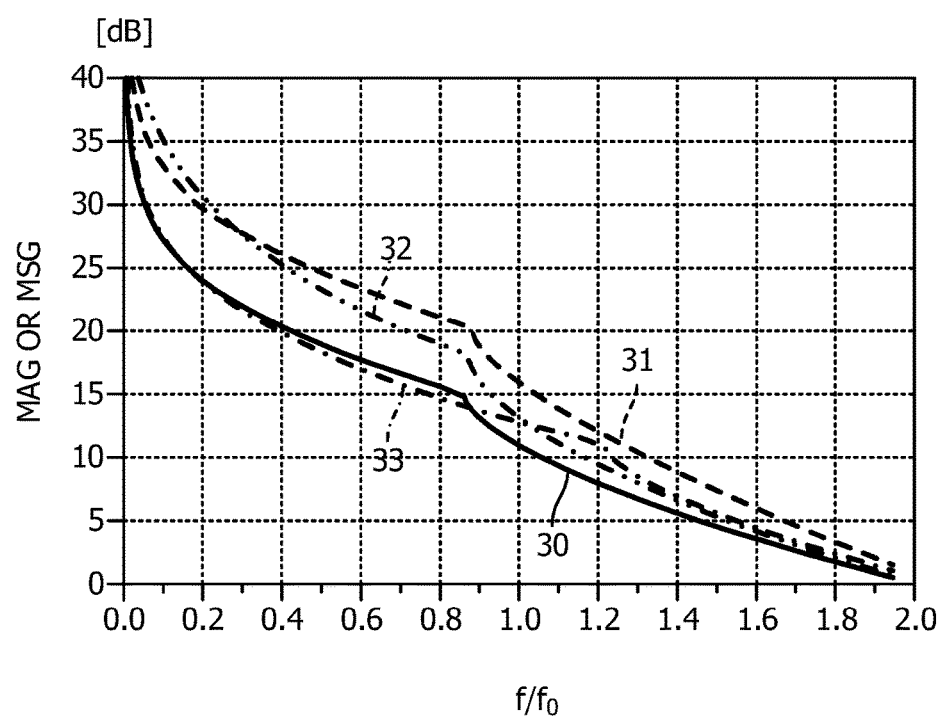
FIG. 25 is a diagram illustrating an example of the gains of the amplifiers according to the comparative example and the first to third embodiments.

FIG. 25 illustrates an example of the gains of the amplifiers 30 to 33. In FIG. 25, when the normalized frequency is 1 or higher, the gains of the amplifiers 31, 32, and 33 that are the circuits are higher than that of the amplifier 30. On the low frequency side, the gain of the amplifier 33 is lower than that of the amplifier 30. However, an inflection point of the amplifier 33 or a point at which the MSG and MAG of the amplifier 33 are switched is shifted to the high frequency side.

Figure 26:
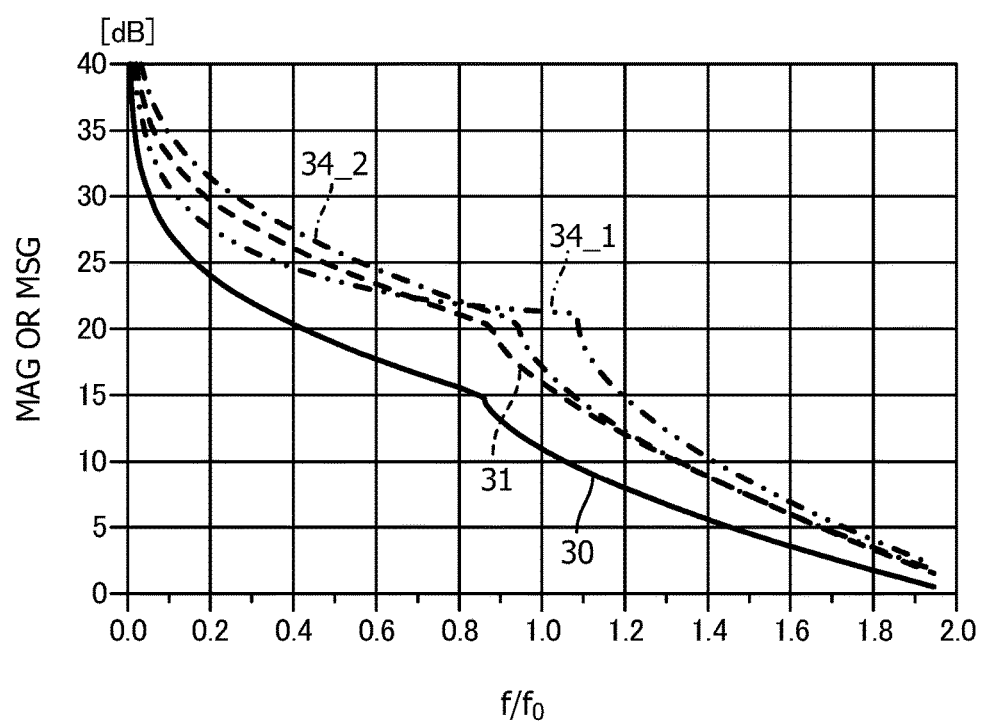
FIG. 26 is a diagram illustrating an example of the gains of the amplifiers according to the comparative example and the first and fourth embodiments.

FIG. 26 illustrates an example of the gains of the amplifiers 30, 31, and 34. In a frequency region higher than the normalized frequency of 1, the amplifier 34 achieves a higher gain than that of the amplifier 31. Since the amplifier 34 includes the feedback paths of the same type as the amplifier 33, a point at the MSG and MAG of the amplifier 34 are switched is shifted to the high frequency side. Thus, on the high frequency side, the gain of the amplifier 34 is higher than that of the amplifier 31.

Figure 27:
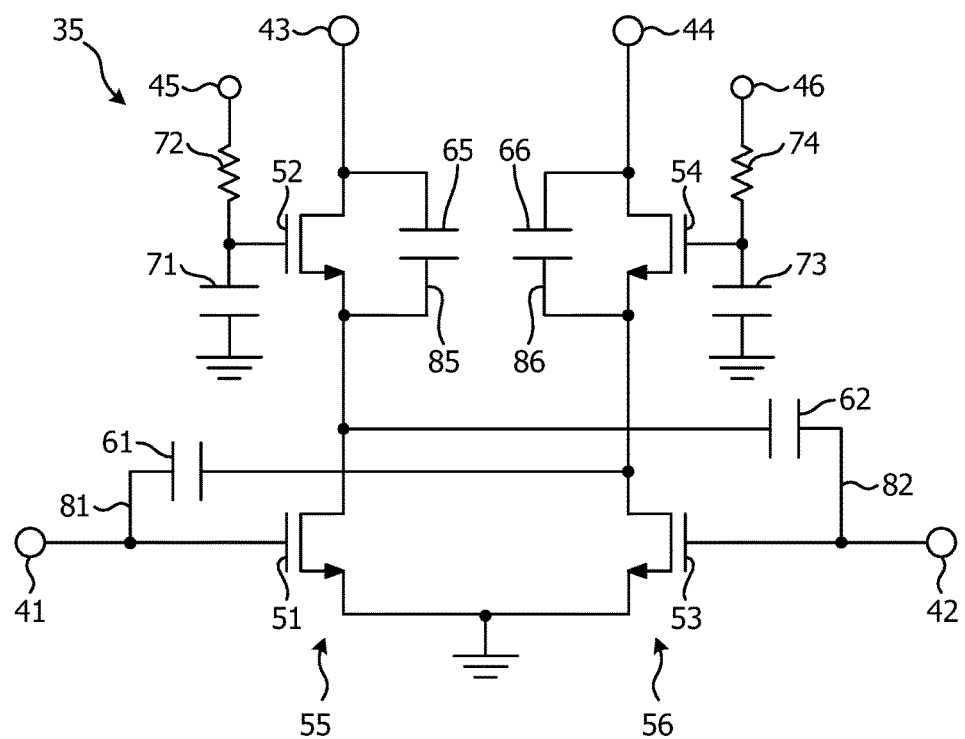
FIG. 27 is a diagram illustrating an example of the configuration of an amplifier according to a fifth embodiment.

FIG. 27 is a diagram illustrating an example of the configuration of an amplifier 35 according to a fifth embodiment. The amplifier 35 is a circuit formed by adding the first feedback path 81, the second feedback path 82, the fifth feedback path 85, and the sixth feedback path 86 to the comparative example illustrated in FIG. 2.

Figure 28:
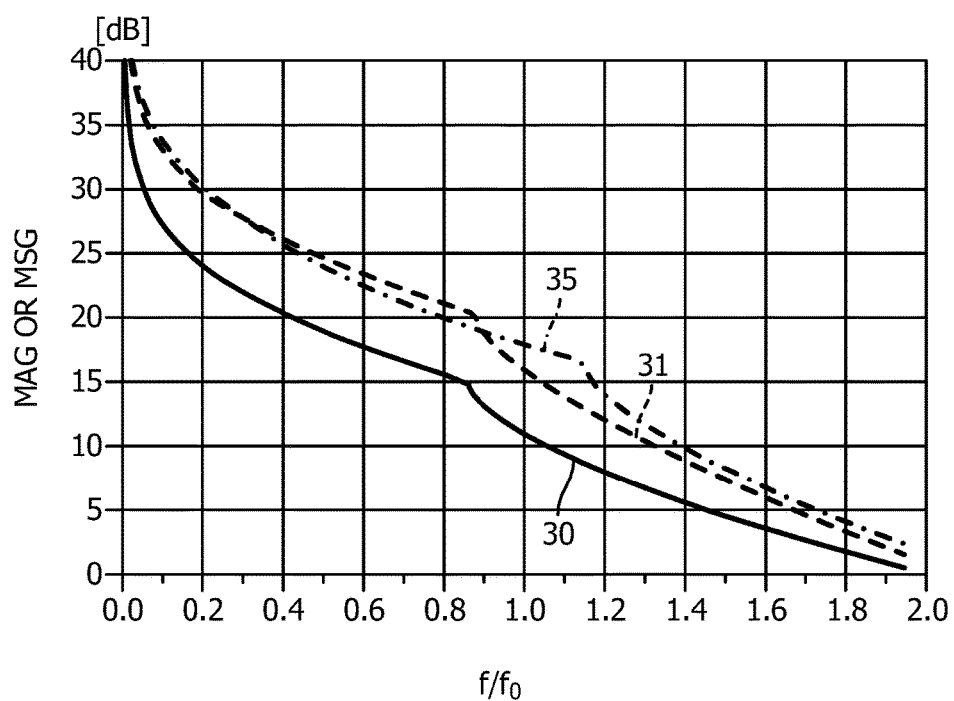
FIG. 28 is a diagram illustrating an example of the gain of the amplifier according to the fifth embodiment.

FIG. 28 illustrates an example of the gain of the amplifier 35. A point at which the MSG and MAG of the amplifier 35 are switched is shifted to the high frequency side, like the amplifier 34. Thus, the amplifier 35 achieves a higher gain than that of the amplifier 31 in the high frequency region higher than the normalized frequency of 1. Thus, the amplifier 35 may achieve a higher gain with the same consumed power, compared with the amplifier 30. In other words, the amplifier 35 may achieve a high gain with low consumed power.

Figure 29:
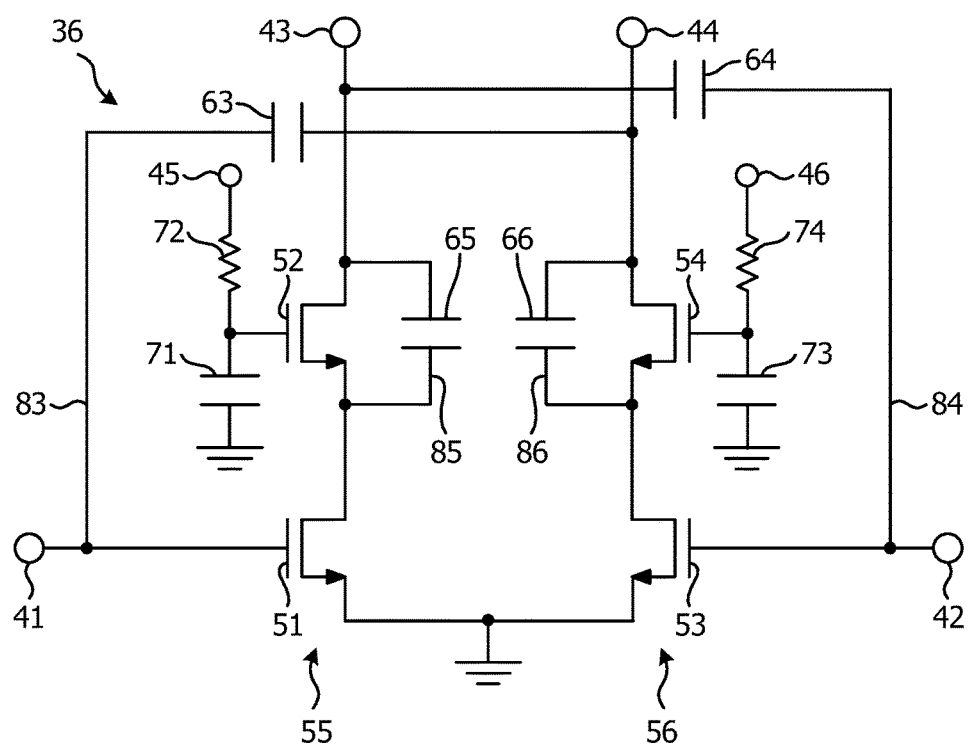
FIG. 29 is a diagram illustrating an example of the configuration of an amplifier according to a sixth embodiment.

FIG. 29 is a diagram illustrating an example of the configuration of an amplifier 36 according to a sixth embodiment. The amplifier 36 is a circuit formed by adding the third feedback path 83, the fourth feedback path 84, the fifth feedback path 85, and the sixth feedback path 86 to the comparative example illustrated in FIG. 2.

Figure 30:
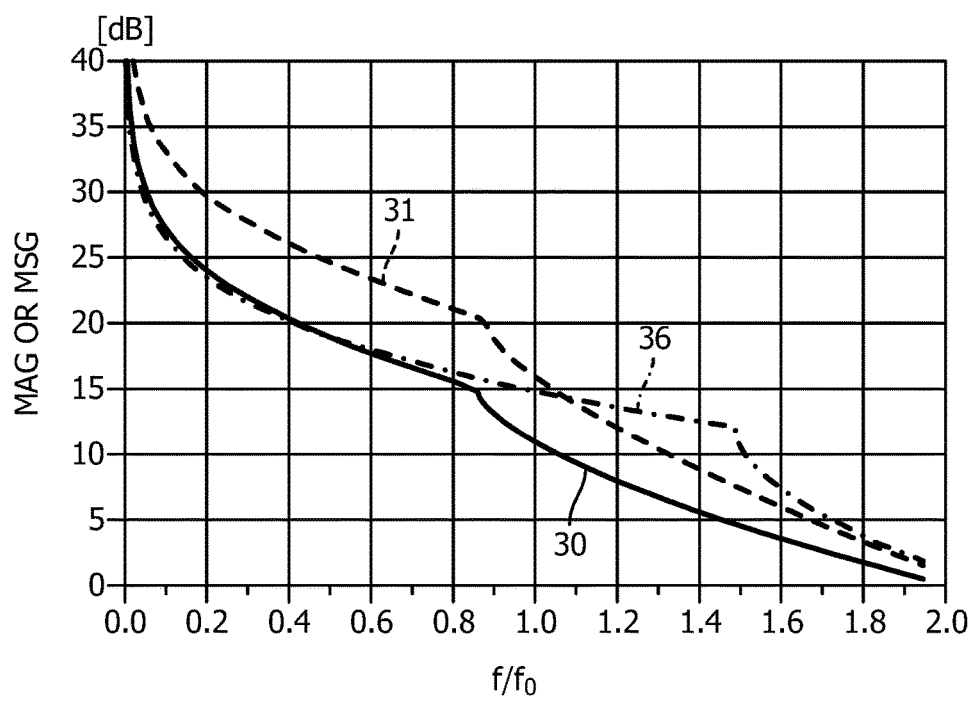
FIG. 30 is a diagram illustrating an example of the gain of the amplifier according to the sixth embodiment.

FIG. 30 illustrates an example of the gain of the amplifier 36. A point at which the MSG and MAG of the amplifier 36 are switched is shifted to the high frequency side, like the amplifier 34. Thus, the amplifier 36 achieves a higher gain than that of the amplifier 31 in the frequency region higher than the normalized frequency of 1. Thus, the amplifier 36 may achieve a higher gain with the same consumed power, compared with the amplifier 30. In other words, the amplifier 36 may achieve a high gain with low consumed power.

Figure 31:
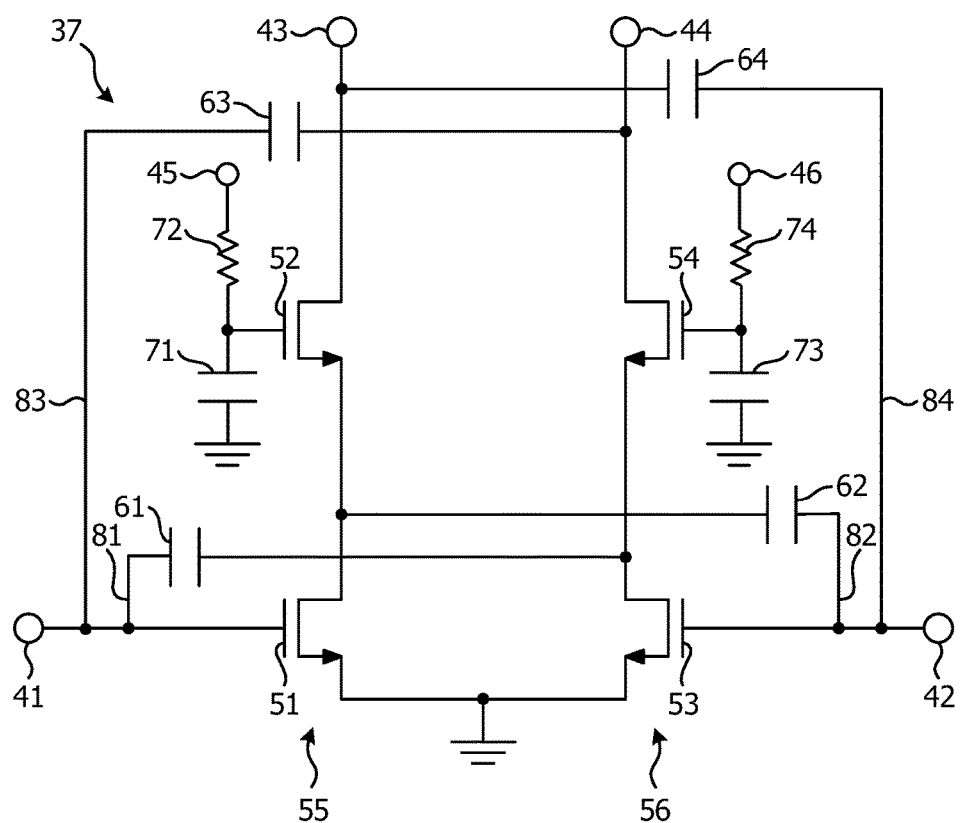
FIG. 31 is a diagram illustrating an example of the configuration of an amplifier according to a seventh embodiment.

FIG. 31 is a diagram illustrating an example of the configuration of an amplifier 37 according to a seventh embodiment. The amplifier 37 is a circuit formed by adding the first feedback path 81, the second feedback path 82, the third feedback path 83, and the fourth feedback path 84 to the comparative example illustrated in FIG. 2.

Figure 32:
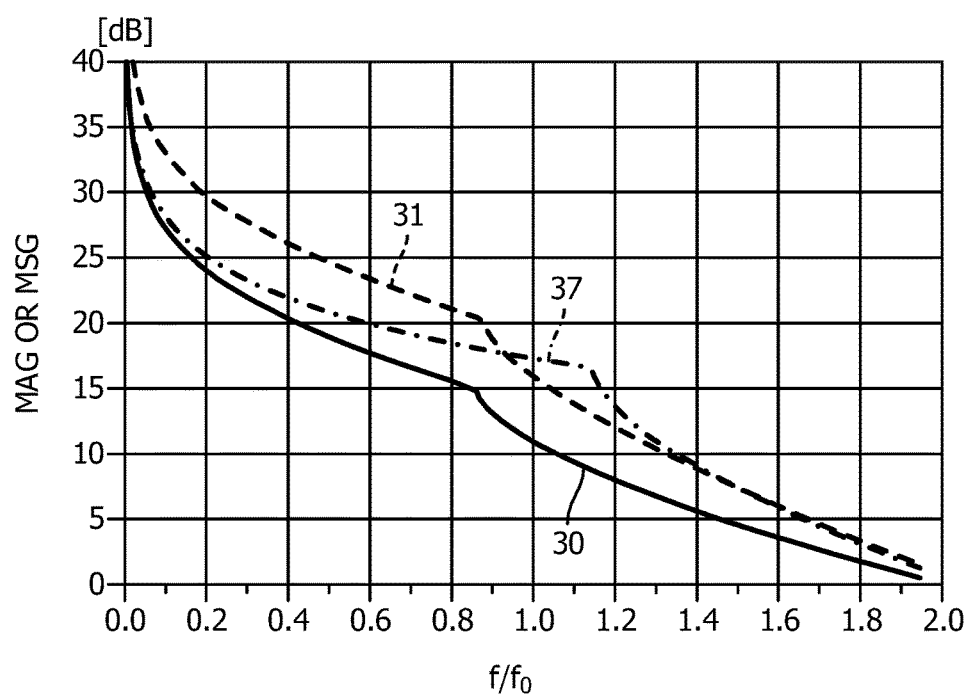
FIG. 32 is a diagram illustrating an example of the gain of the amplifier according to the seventh embodiment.

FIG. 32 illustrates an example of the gain of the amplifier 37. In a region close to the normalized frequency of 1 and the frequency region higher than the normalized frequency of 1, the amplifier 37 achieves a higher gain than that of the amplifier 31. Thus, the amplifier 37 may achieve a higher gain with the same consumed power, compared with the amplifier 30. In other words, the amplifier 37 may achieve a high gain with low consumed power.

The amplifiers according to the embodiments may achieve high gains with low consumed power. For example, the antenna gain of the transmitting device 10 and the antenna gain of the receiving device 20 may be increased by applying amplifiers according to any of the embodiments to amplifiers (at least one type of the transmission low noise amplifiers 13, the transmission amplifiers 15, the reception low noise amplifiers 25, and the reception amplifiers 23) illustrated in FIG. 1, while an increase in power consumed by the application system 1 is suppressed.

Although the amplifiers are described in the embodiments, the present disclosure is not limited to the aforementioned embodiments. Various modifications and improvements such as a combination with a part or all of another embodiment and replacement with a part or all of another embodiment may be made within the scope of the disclosure.

For example, the aforementioned embodiments exemplify the case where the transistors are field-effect transistors. The transistors, however, may be bipolar transistors. If the transistors are bipolar transistors, the sources are replaced with emitters, the common sources are replaced with common emitters, the gates are replaced with bases, the common gates are replaced with common bases, and the drains are replaced with collectors in the aforementioned embodiments.

In addition, at least one of the first, second, third, and fourth transistors may be a field-effect transistor, and the other transistors may be bipolar transistors.

In addition, although the aforementioned embodiments exemplifies the capacitors as examples of the capacitative elements, the capacitative elements are not limited to the normally so-called "capacitors". The capacitive elements are used as capacitance components for the feedback and not used as inductance components for the feedback and may be elements having capacitance components as main components. If CMOS is used, MOS transistors are used as the capacitative elements in some cases. For example, if drains and sources are short-circuited, MOS transistors, each of which has two terminals, a gate terminal and a drain source short-circuit terminal, are used as the capacitative elements. In addition, varactor diodes (variable-capacitance diodes) may be used as the capacitative elements.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier comprising:
a first cascode circuit including:
   a first transistor; and
   a second transistor whose source or emitter is coupled to a drain or a collector of the first transistor;
a second cascode circuit that forms a differential pair with the first cascode circuit, the second cascode circuit including:
   a third transistor whose source or emitter is coupled to a source or an emitter of the first transistor; and
   a fourth transistor whose source or emitter is coupled to a drain or collector of the third transistor;
a first feedback path that couples between an output terminal of the third transistor and an input terminal of the first transistor, the first feedback path including a first capacitative element;
a second feedback path that couples between an output terminal of the first transistor and an input terminal of the third transistor, the second feedback path including a second capacitative element;
a third feedback path that couples between an output terminal of the second transistor and an input terminal of the second transistor, the third feedback path including a third capacitative element;
a fourth feedback path that couples between an output terminal of the fourth transistor and an input terminal of the fourth transistor, the fourth feedback path including a fourth capacitative element;
a fifth feedback path that couples between an output terminal of the fourth transistor and the input terminal of the first transistor, the fifth feedback path including a fifth capacitative element; and
a sixth feedback path that couples between an output terminal of the second transistor and the input terminal of the third transistor, the sixth feedback path including a sixth capacitative element.

2. An amplifier comprising:
a pair of cascode circuits as a differential pair, each cascode circuit including:
   a first transistor;
   a second transistor whose source or emitter is connected to a drain or collector of the first transistor; and
   a feedback path that couples between an output terminal of the second transistor and an input terminal of the second transistor, the feedback path including a capacitative element; and
a pair of capacitative elements and a pair of feedback paths,
wherein one of the pair of the feedback paths is a path on which an output terminal of a second transistor included in one of the cascode circuits forming the differential pair is connected to an input terminal of a first transistor included in the other of the cascode circuits forming the differential pair via one of the pair of capacitative elements, and
wherein the other of the pair of the feedback paths is a path on which an output terminal of a second transistor included in the other of the cascode circuits forming the differential pair is connected to an input terminal of a first transistor included in the other of the cascode circuits forming the differential pair via the other of the pair of capacitative elements.

* * * * *